(12) United States Patent
Maehashi

(10) Patent No.: US 6,389,829 B2
(45) Date of Patent: May 21, 2002

(54) TEMPERATURE CONTROL SYSTEM

(75) Inventor: Masato Maehashi, Yokohama (JP)

(73) Assignee: Innotech Corporation, Kanagawa (JP)

( * ) Notice: Subject to any disclaimer, the term of this patent is extended or adjusted under 35 U.S.C. 154(b) by 0 days.

(21) Appl. No.: 09/725,787

(22) Filed: Nov. 29, 2000

(30) Foreign Application Priority Data

Nov. 30, 1999 (JP) .......................................... 11-339692

(51) Int. Cl.$^7$ ............................................. F25D 17/02
(52) U.S. Cl. ............................. 62/201; 62/3.2; 62/179; 62/185
(58) Field of Search ................... 62/201, 185, 3.2, 62/208, 209, 179; 438/5

(56) References Cited

U.S. PATENT DOCUMENTS

| | | | |
|---|---|---|---|
| 3,381,490 A | * | 5/1968 | Manning et al. ............... 62/201 |
| 4,459,818 A | * | 7/1984 | Kaya et al. .................... 62/201 |
| 4,984,628 A | * | 1/1991 | Uchida et al. ................. 165/26 |
| 5,724,825 A | * | 3/1998 | Lee et al. ...................... 62/185 |
| 5,996,353 A | * | 12/1999 | Maxwell et al. ............... 62/3.2 |
| 6,085,532 A | * | 7/2000 | Sibik ............................ 62/179 |
| 6,276,152 B1 | * | 8/2001 | Sibik ............................ 62/201 |

* cited by examiner

Primary Examiner—Denise L. Esquivel
Assistant Examiner—Marc Norman
(74) Attorney, Agent, or Firm—Steinberg & Raskin, P.C.

(57) ABSTRACT

An object of the present invention is to provide a temperature control system in a simple constitution as well as be capable of strictly controlling the temperature on the side of the process device of the fluid supplied via the pathway from the chiller device. The present invention comprises the fluid supplying pathway 4 and the return pathway 5 connecting the process device 1 to the chiller device 2, the first temperature control section 3 controlling the temperature of the outlet 1a of the chiller device 1 and the second temperature control section 6 provided in the supplying pathway 4, wherein the second temperature control section 6 supplies the fluid to the above-described process device 2 after finely controlling the temperature of the fluid supplied from the above-described chiller device 1 as well as detects the temperature T1 on the side of the process device and requires the outlet temperature T2 of the chiller device for the first temperature control section corresponding to the detected temperature.

2 Claims, 1 Drawing Sheet

TEMPERATURE CONTROL SYSTEM

BACKGROUND OF THE INVENTION

1. Field of the Invention

The present invention relates to a temperature control system carrying out cooling and heating of a process device such as a semiconductor and the like, which requires a fine temperature control.

2. Description of the Related Art

A system circuit which cools a semiconductor process device 2 by a chiller device 1 is shown in FIG. 2. The chiller device 1 has a first temperature control section 3 and controls a temperature T2 of an outlet 1a of the chiller device 1 by this first temperature control section 3. A fluid which is temperature-controlled by the above-described first temperature control section 3 is supplied to a fluid pipe (not shown) in the process device 2 via a supplying pathway 4 and returns to the chiller device 1 via a return pathway 5.

The above-described first temperature control section 3 controls the temperature of circulating fluid, which is supplied to the supplying pathway 4, at the outlet 1a of the chiller device 1 in order to maintain the temperature at the predetermined temperature of the process device 2.

SUMMARY OF THE INVENTION

Among the semiconductor process devices 2s, there are some devices in which even the slightest change of the temperature will have influence upon the quality of the products. For these devices, the temperature of the supplying fluid has to be precisely controlled.

In contract to this, the first temperature control section 3 of the above-described chiller device 1 only controls the outlet temperature T2. Since the distance between the chiller device 1 and the process device 2 is apart, the temperature of the fluid will change from T2 to (T2+ΔT) during the fluid moving from the above-described outlet 1a to the process device 2. Therefore, the temperature T2 of the above-described outlet 1a is set in consideration of the distance to the process device 2. Specifically, when the required temperature is set at T3 on the side of the process device 2, the expression representing the relationship of the factors must be as follows:

Outlet temperature T2 of the chiller device 1=(T3−ΔT)

However, because the temperature changing is also present in the installation circumstances of the pathways 4, 5, the above-described ΔT cannot be predicted precisely. Thus, in the case where the amount of temperature changing ΔT in the supplying pathway 4 cannot be predicted, it is very difficult to precisely control the temperature of the fluid T3 which is supplied to the process device 2.

On the other hand, if the above-described pathways 4, 5 are shortened and the chiller device 1 can be brought into intimate contact with the process device 2, it is considered that the influence of the temperature changing in the pathway can be ignored, however, such a thing is actually impossible to carry out. Because if the chiller device 1 is installed within a clean room in which the process device 2 is installed, the clean room will be too large and the cost will be higher. Moreover, among the semiconductor process devices, there are some devices which are easily influenced with electromagnetic waves, it is the reason why it is not preferable that the chiller device 1 having a coil is installed nearby these devices.

Hence, in reality, it was very difficult to strictly control the temperature of the fluid which is supplied to the process device 2 while also corresponding to changing of installation circumstances of the temperature control system.

Otherwise, in order to control the temperature changing ΔT in the supplying pathway, even the temperature of installation circumstances of the above-described pathway 4 must have been also strictly controlled by providing a complex control mechanism.

An object of the present invention is to provide a temperature control system which has a simple structure as well as is capable of strictly controlling the temperature on the side of the process device of the fluid supplied via the pathway from the chiller device.

The first embodiment of the present invention having a fluid supplying pathway and a return pathway connecting a process device such as a semiconductor manufacturing device and the like to a chiller device, a first temperature control section controlling an outlet temperature of the chiller device and a second temperature control section provided in the above-described supplying pathway, and is characterized in that this second temperature control section supplies the fluid to the above-described process device after the temperature of the fluid supplied from the above-described chiller device is finely controlled as well as detects the temperature on the side of the process device, requires the temperature of outlet of the chiller device for the first temperature control section.

The second embodiment of the present invention is characterized in that the second temperature control section has a Peltier element

DESCRIPTION OF THE PREFERRED EMBODIMENTS

Figure 1:
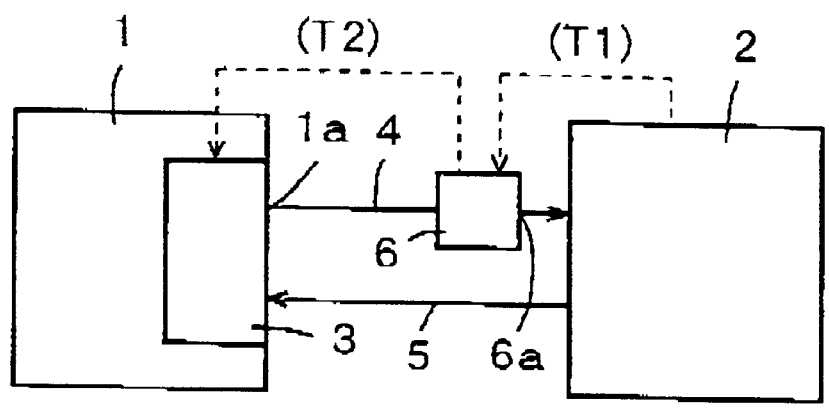
FIG. 1 is a block diagram showing a temperature control system of an embodiment of the present invention.
Figure 2:
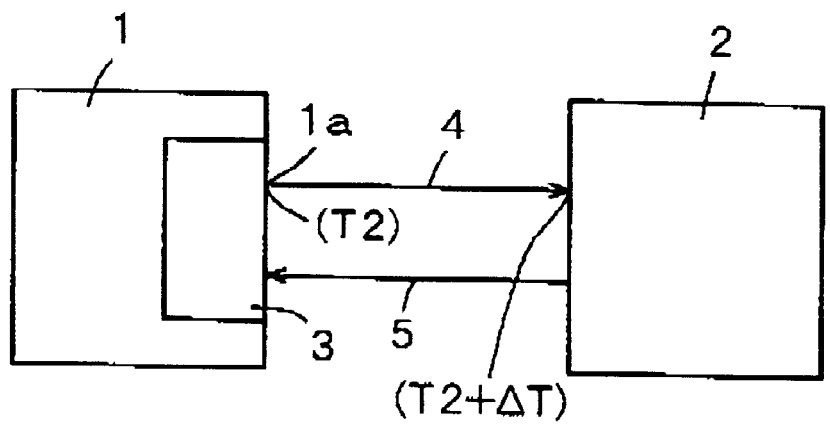
FIG. 2 is a block diagram showing a temperature control system of a conventional example.

In FIG. 1, the embodiment of the present invention is shown.

The present system is identical with conventional examples in that the fluid supplying pathway 4 and the return pathway 5 connect between the chiller device 1 having the first temperature control section and the process device 2.

However, the present embodiment of the present invention differs from conventional ones in that the second temperature control section 6 is provided therein.

This second temperature control section 6 having a Peltier element inside of it, by which the fluid is heated and cooled. By this Peltier element, heating and cooling can be carried out with the precision of ±0.001° C. However, since Peltier effect is small in metals in general, only fine control is carried out without largely changing the temperature by the second temperature control section 6. Moreover, the above-described second temperature control section 6 is installed as near to the process device 2 as possible.

Moreover, the above-described second control section 6 detects the temperature T1 on the side of the process device 2 and outputs a signal requiring the outlet temperature T2 of the chiller device 1 corresponding to its detected temperature.

A method of controlling the temperature of the fluid T3 supplied to the process device 2 by such a temperature control system with a high precision will be described below.

The second temperature control section 6 detects the temperature T1 of the process device 2. In reality, as it is almost impossible that the temperature within the process device 2 is directly measured, measurement is carried out on the portion of the fluid supply line adjacent to the process device 2. Then, when the fluid of temperature T3 must be supplied to the process device 2, the second temperature control section 6 requires the temperature T2 for the first temperature control section 3.

It should be noted that the temperature T2 which the above-described second temperature control section 6 requires for the first temperature control section 3 is near to the value of the above-described temperature T3, but the value is one which is also considered of temperature changing $\Delta T$ in the pathway from the chiller device 1 to the second temperature control section 6. However, since this temperature changing $\Delta T$ is subjected to the influence of the installation circumstances change of the supplying pathway 4 as described in the above-described conventional example, this temperature changing $\Delta T$ cannot be precisely predicted in a degree of the precision which is required from the side of the process device 2. Thus, even if the temperature changing $\Delta T$ in the supplying flow pathway 4 cannot be precisely predicted, as described later, it will be good because fine control can be carried out in the second temperature control section 6.

When a required signal of the temperature T2 is inputted from the second temperature control section 6 to the first temperature control section 3, the first temperature control section 3 controls the temperature of the outlet 1a of the chiller device 1 supposing a temperature T2 as the setting temperature. The fluid of the outlet temperature T2 controlled by the first temperature control section 3 is changed in the supplying pathway 4, becomes the temperature (T2+$\Delta T$), and reaches the second temperature control section 6. At this moment, the expression comes into existence as follows:

temperature of fluid (T2+$\Delta T$)≈T3.

Then, in the case where the difference between the temperature (T2+$\Delta T$) and the required temperature T3 of the side of the process device 2 exceeds over the predetermined range of temperature, the temperature is finely controlled by the second temperature control section 6.

Specifically, the second temperature control section 6 controls the fluid of the temperature (T2+$\Delta T$) into the temperature T3 with the high precision of ±0.001° C. and supplies it from the outlet 6a to the supplying pathway 4.

At this moment, since the second control section 6 is made neighboring to the process device 2, the temperature changing occurred from the outlet 6a of the second control section 6 to the process device 2 can be ignored.

In the system of the above-described embodiment, the temperature of the fluid supplied to the process device 2 can be controlled with very high precision.

In the system of the above-described embodiment, a rough temperature control is carried out by the first temperature control section 3 of the chiller device 1, and the precision fine control is carried out by the second temperature control section 6. Thus, as roles are divided by the two temperature control sections, not only the first temperature control section 3 but also the second temperature control section 6 can be realized in simplified structures, respectively.

The first temperature control section 3 is required in a wide range of temperature control, however, temperature control with such a high precision is not required.

On the other hand, as it will be good enough for the second temperature control section 6 only to finely control the roughly controlled predetermined temperature, even if the second temperature control section 6 cannot follow a larger temperature changing, it will be good enough for it to have a mechanism capable of finely controlling in a narrower range.

Then, temperature changing after the fine control can be ignored by separating the second temperature control section 6 carrying out the fine control from the chiller device 1 and installing it neighboring to the process device 2.

Moreover, although the Peltier element is employed as a fine control means in the above embodiment, especially, if the element having a larger Peltier effect is employed, the second temperature control section will be more costly. But since as the above-described fine control means, it will be good only if the precision is primarily higher and even it control range is narrower, the cheaper element for its narrower range can be utilized.

It should be noted that although cooling and heating is carried out using a Peltier element in the above-described embodiment, fine control means in the second temperature control section 6 is not limited for the Peltier element. Moreover, it will be good enough to carry out the cooling and heating at the time when the fine control is carried out by respective separate means. For example, it will be good to equip with a heater for heating and to mix a small amount of the fluid cooled by the other freezer for cooling.

Furthermore, provided that the temperature T2 is set so that the temperature of the fluid supplied from the chiller device 1 to the second temperature control section 6 is always lower, it will be good to equip the second temperature control section 6 with only a heating mechanism such as a heater and the like.

According to the first embodiment of the present invention, temperature control of the fluid supplied to the process device for the purpose of temperature control has been made carried out by the first temperature control section carrying out the outlet of the chiller device and by the second temperature control section carrying out in the supplying pathway, a rough temperature control and a fine control can be carried out by the separate temperature control sections. Therefore, since it will be good enough for the second temperature control section carrying out a fine control only to correspond with a smaller range of control, the first embodiment of the present invention can utilize a simpler and cheaper mechanism than those utilized in the device carrying out the temperature control in high precision and the wider range.

Moreover, since the first embodiment of the present invention separates the second temperature control section from the chiller device, the second temperature control section is made neighboring to the process device. Therefore, the temperature of the fluid which has been finely controlled by the second temperature control section is supplied to the process device as it is. That is to say, the temperature of the fluid supplying to the process device can be controlled with a high precision.

According to the second embodiment of the present invention, both heating and cooling for a fine control can be carried out by one Peltier element. Therefore, it is not necessary to separately provide heating means and cooling means. For that space, the second temperature control section will be more compact in size, and the degree of freedom concerning with the installation place is also increased.

What is claimed is:

1. A temperature control system comprising a fluid supplying pathway and a return pathway connecting a process device and a chiller device, a first temperature control section controlling an outlet temperature of said chiller device and a second temperature control section provided in said supplying pathway, wherein said second temperature control section supplies said fluid to said process device after finely controlling a temperature of said fluid supplied from said chiller device as well as said second temperature control section detects a temperature on the side of said process device and requires an outlet temperature of said chiller device for said first temperature control section corresponding to said detected temperature.

2. A temperature control system according to claim 1, wherein said second temperature control section has a Peltier element.

* * * * *